United States Patent
Fujimoto

(10) Patent No.: US 10,624,231 B2
(45) Date of Patent: Apr. 14, 2020

(54) CONTROLLER FOR MACHINE

(71) Applicant: FANUC CORPORATION, Yamanashi (JP)

(72) Inventor: Taisei Fujimoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/217,884

(22) Filed: Dec. 12, 2018

(65) Prior Publication Data
US 2019/0200478 A1 Jun. 27, 2019

(30) Foreign Application Priority Data

Dec. 27, 2017 (JP) .................................. 2017-251829

(51) Int. Cl.
| | |
|---|---|
| H05K 7/20 | (2006.01) |
| G05D 22/02 | (2006.01) |
| G05D 23/19 | (2006.01) |
| F24F 11/30 | (2018.01) |
| F24F 110/20 | (2018.01) |

(52) U.S. Cl.
CPC ............... *H05K 7/20* (2013.01); *F24F 11/30* (2018.01); *G05D 22/02* (2013.01); *G05D 23/1917* (2013.01); *F24F 2110/20* (2018.01)

(58) Field of Classification Search
CPC ........ H05K 7/20; F24F 11/30; F24F 2110/20; G05D 23/1917; G05D 22/02
See application file for complete search history.

(56) References Cited

U.S. PATENT DOCUMENTS 7,898,805 B2 * 3/2011 MacDonald ............ G06F 1/203
 165/104.33
2010/0167636 A1 * 7/2010 Bhattacharya .......... G06F 1/206
 454/239

FOREIGN PATENT DOCUMENTS

| JP | H04-007898 A | 1/1992 |
| JP | H09-138044 A | 5/1997 |
| JP | 2008-141089 A | 6/2008 |
| WO | 2004/089052 A1 | 10/2004 |

* cited by examiner

*Primary Examiner* — Larry L Furdge
(74) *Attorney, Agent, or Firm* — Studebaker & Brackett PC

(57) ABSTRACT

A controller, capable of maintaining proper humidity for a machine, and including a housing; a sensor in the housing; a fan that blows air in the housing; a window openable and closable relative to an opening in the housing; a tank with an opening part at a neighboring position of the opening and storing a liquid containing water; a pipe having a part extending in the housing, and connected to the tank to pass the liquid; and a humidity controller that controls humidity in the housing. If humidity sensed by the sensor is lower than a predetermined value, the humidity controller opens the window, and operates the fan to take moisture from the tank into the housing. If the humidity is higher than the predetermined value, the humidity controller closes the window, and operates the fan to feed an atmosphere in the housing toward the part of the pipe.

2 Claims, 6 Drawing Sheets

CONTROLLER FOR MACHINE

This application is based on and claims the benefit of priority from Japanese Patent Application No. 2017-251829, filed on 27 Dec. 2017, the content of which is incorporated herein by reference.

BACKGROUND OF THE INVENTION

Field of the Invention

The present invention relates to a controller for a machine, more specifically, to a controller for a machine to control a humidity in a control panel.

Related Art

It has been known conventionally that a humidity is prone to change in a control panel for a machine tool on which electronic equipment is installed. A high humidity causes condensation. If a humidity is too low, static electricity is generated. Hence, it is desirable that the interior of the control panel be always maintained at a proper humidity for operating the electronic equipment normally.

A method using a Peltier element has been suggested as a humidity control method (see patent document 1, for example). This method utilizes the fact that, when an atmosphere is cooled using the Peltier element, dehumidifying effect is achieved simultaneously. Specifically, if a humidity exceeds a predetermined value, a cooler is operated to dehumidify the interior of a device. As shown in FIG. 6, a configuration with a control panel cooler has been known as a dehumidifying method peculiar to a machine tool using the same principle.

Patent Document 1: Japanese Unexamined Patent Application, Publication No. 2008-141089

SUMMARY OF THE INVENTION

The configuration of patent document 1 additionally requires the Peltier element. Meanwhile, the control panel cooler shown in FIG. 6 is costly. Further, both of these configurations fail to humidify the interior of the control panel.

The present invention is intended to provide a controller capable of always maintaining a proper humidity using an inexpensive device.

(1) A controller for a machine (controller 10 described later, for example) comprises: a housing (control panel 12 described later, for example); a humidity acquisition unit (humidity sensor 20 described later, for example) housed in the housing; a fan (fan 18 described later, for example) attached to the housing and blowing air in the housing; a first window (first window 16 described later, for example) formed to be openable and closable relative to a first opening (first opening O described later, for example) formed at the housing; a tank (coolant tank 14 described later, for example) with an opening part located at a neighboring position of the first opening and storing a liquid containing water (cutting fluid described later, for example); a pipe (pipe 24 described later, for example) having a part extending in the housing, and being connected to the tank to let the liquid pass through; and a control unit (control unit 22 described later, for example) that controls a humidity in the housing. If a humidity acquired by the humidity acquisition unit is lower than a predetermined value, the control unit opens the first window, and operates the fan so as to take moisture generated from the tank into the housing. If the humidity acquired by the humidity acquisition unit is higher than the predetermined value, the control unit closes the first window, and operates the fan so as to feed an atmosphere in the housing toward the part of the pipe.

(2) The controller for a machine described in (1) may further comprise: a temperature acquisition unit (temperature sensor 32 described later, for example) housed in the housing; and a second window (second window 30 described later, for example) formed to be openable and closable relative to a second opening (second opening P described later, for example) formed at the housing. If a temperature acquired by the temperature acquisition unit is higher than a predetermined value, the control unit may open the second window, and operate the fan so as to discharge an atmosphere in the housing.

In the controller for a machine described in (1) or (2), the housing may include multiple housings, and humidities in the multiple housings may be controllable by the control unit.

The present invention can provide a controller capable of always maintaining a proper humidity using an inexpensive device.

DETAILED DESCRIPTION OF THE INVENTION

Figure 1:
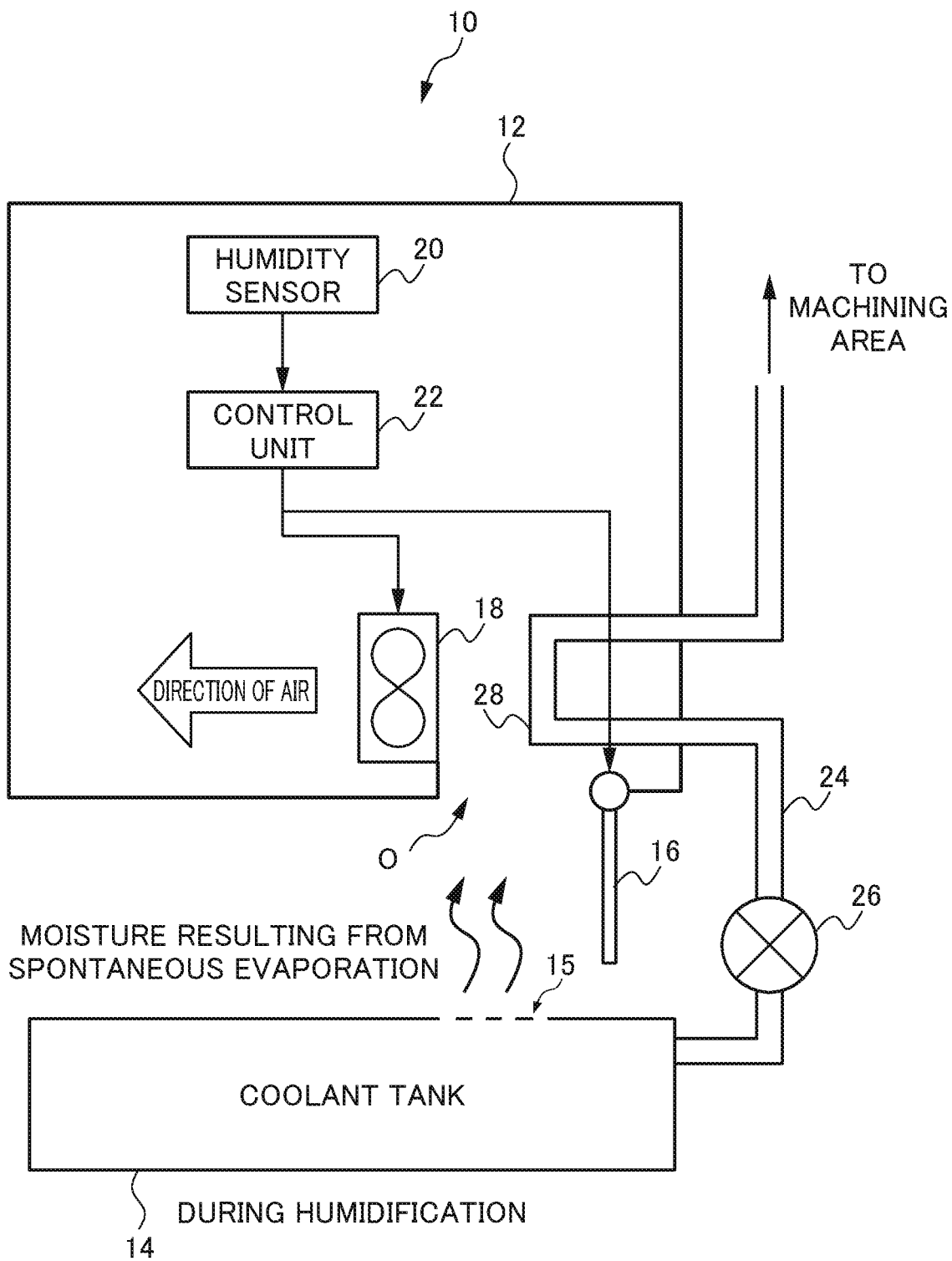
FIG. 1 shows a humidifying mode executed in a controller according to a first embodiment of the present invention.

Embodiments of the present invention will be described below by referring to the drawings. FIG. 1 shows a controller according to a first embodiment of the present invention. A controller 10 is to control a machine such as a machine tool not shown. The controller 10 includes a control panel (housing) 12 and a coolant tank (tank 14). A first opening O is formed at a part of the control panel 12. The first opening O is located at a neighboring position of the coolant tank 14. A first window 16 is attached to the first opening O so as to be openable and closable. The first window 16 is usable for closing the first opening O. A fan 18 is attached to a position near the first opening O. A control unit 22 controls the first window 16 and the fan 18 based on a humidity detected by a humidity sensor (humidity acquisition unit) 20.

A pipe 24 is connected to the coolant tank 14. The pipe 24 lets a cutting fluid in the tank 14 pass through. A pump 26 is interposed in the pipe 24 and used for adjusting the flow rate of the cutting fluid. The pipe 24 includes a dehumidifying unit 28 forming a part of the pipe 24. The dehumidifying unit 28 extends to pass through the interior of the control panel 12. The dehumidifying unit 28 is located at a position facing the fan 18.

The motion of the controller 10 according to the first embodiment will be described. In the first embodiment, a humidifying mode and a dehumidifying mode are prepared. FIG. 1 shows motion in the humidifying mode. The humidifying mode is executed if a humidity in the control panel 12 detected by the humidity sensor 20 is lower than a predetermined value.

The tank 14 is closed with a lid 15 made of a metal mesh, for example. Thus, the fluid surface of the cutting fluid is exposed to external air to generate moisture resulting from spontaneous evaporation. If a humidity detected by the humidity sensor 20 falls below the predetermined value, the control unit 22 opens the first window 16. Further, the control unit 22 rotates the fan 18 clockwise so as to generate an air flow in a direction indicated by an arrow. At this time, moisture generated from the tank 14 provided at a neighboring position of the first opening O is taken into the control panel 12. In this way, the humidity in the control panel 12 is increased.

In the configuration of FIG. 1, the lid 15 of the tank 14 is not always required to be a metal mesh but it may have a shape allowing emission of moisture from the cutting fluid. Any shape allowing emission of moisture is applicable. For example, an opening may be formed at a part of the lid 15 of the tank 14. In another case, if a state of preventing leakage of the cutting fluid can be maintained, an opening may be formed at a part of a lateral surface, not at the lid 15. The first opening O is located at the neighboring position of the coolant tank 14. The neighboring position mentioned herein means a position that allows intake of moisture from the coolant tank 14.

Figure 2:
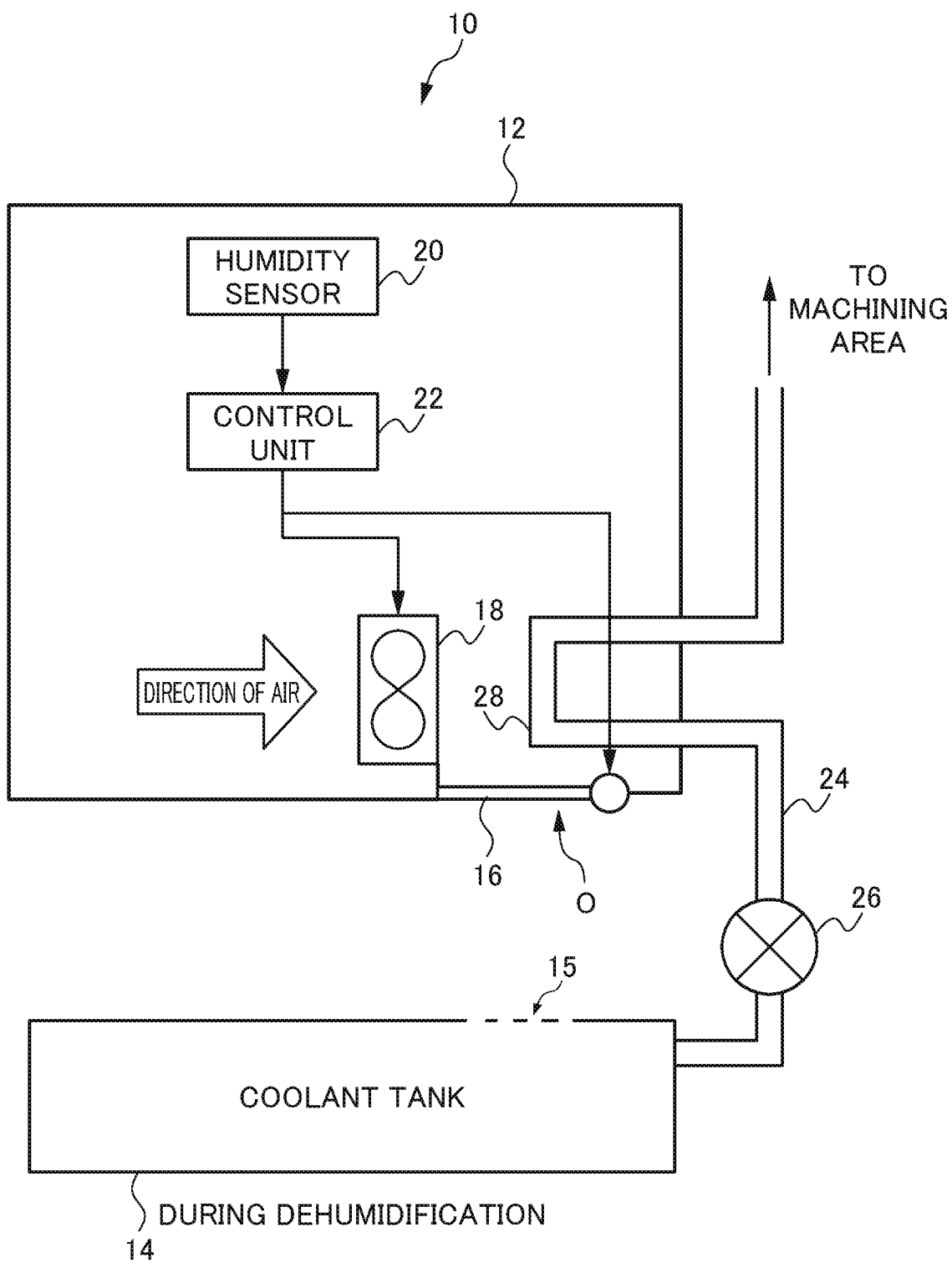
FIG. 2 shows a dehumidifying mode executed in the controller according to the first embodiment of the present invention.

FIG. 2 shows motion in the dehumidifying mode. The dehumidifying mode is executed if a humidity in the control panel 12 detected by the humidity sensor 20 is higher than the predetermined value.

If a humidity detected by the humidity sensor 20 is higher than the predetermined value, the control unit 22 closes the first window 16 to close the first opening O. Further, the control unit 22 rotates the fan 18 counterclockwise so as to generate an air flow in a direction indicated by an arrow. At this time, an atmosphere in the control panel 12 is blown against the dehumidifying unit 28 forming a part of the pipe 24. In the dehumidifying unit 28, water vapor contained in the atmosphere blown against the dehumidifying unit 28 is condensed and the condensed water vapor becomes water droplets. The water droplets are discharged through an outlet (not shown) provided at the control panel 12. In this way, the humidity in the control panel 12 is reduced.

The dehumidifying unit 28 shown in FIG. 2 has a length relatively short, compared to the length of the outer periphery of the control panel 12. However, the dehumidifying unit 28 may be longer. Increase in the length of the dehumidifying unit 28 produces higher dehumidifying effect.

Figure 6:
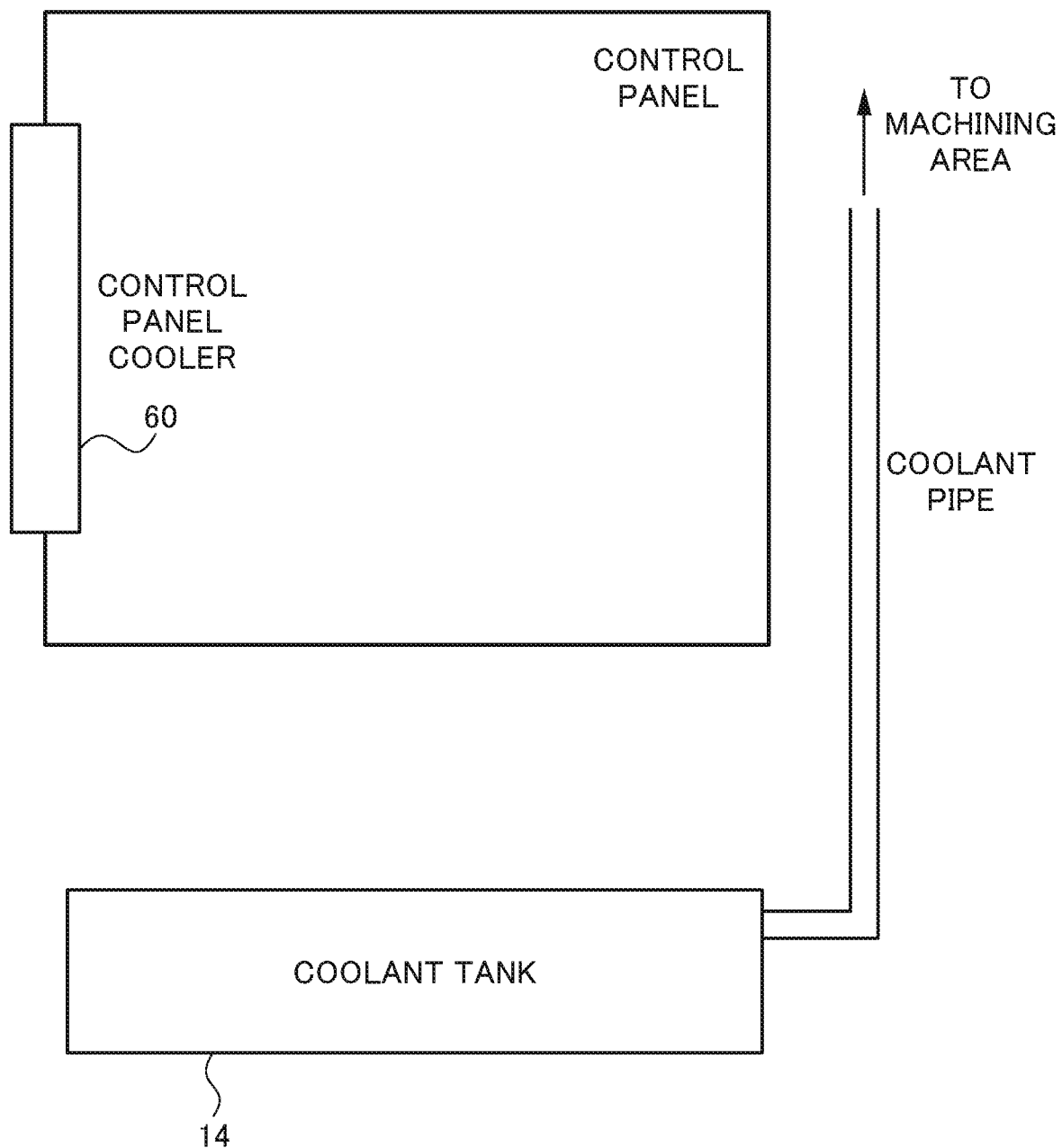
FIG. 6 shows a conventional configuration.

As described above, in the controller of the first embodiment, both the humidifying control and the dehumidifying control are achieved with an inexpensive and simple configuration. Specifically, in comparison to the conventional configuration shown in FIG. 6, a costly control panel cooler 60 used for dehumidification is unnecessary. Further, the present invention can become enabled only by making change using a simple technique to a conventional control panel 12 including formation of the first opening O, installation of the fan 18, and provision of the dehumidifying unit 28. This achieves the effect of always maintaining the interior of the control panel 12 at a proper humidity.

In the configuration of the first embodiment, the fan 18 is attached to the position near the first opening O. However, the position of the fan 18 is only required to be a position allowing intake of moisture from the tank 14. In another case, if the fan 18 is not allowed to be located near the first opening O, a duct (not shown) may be provided to facilitate passage of air through the first opening O. Specifically, the foregoing configuration of rotating one fan 18 clockwise/counterclockwise is not always required but multiple fans 18 may be provided in response to a configuration for passage of air through the first opening O.

Figure 3:
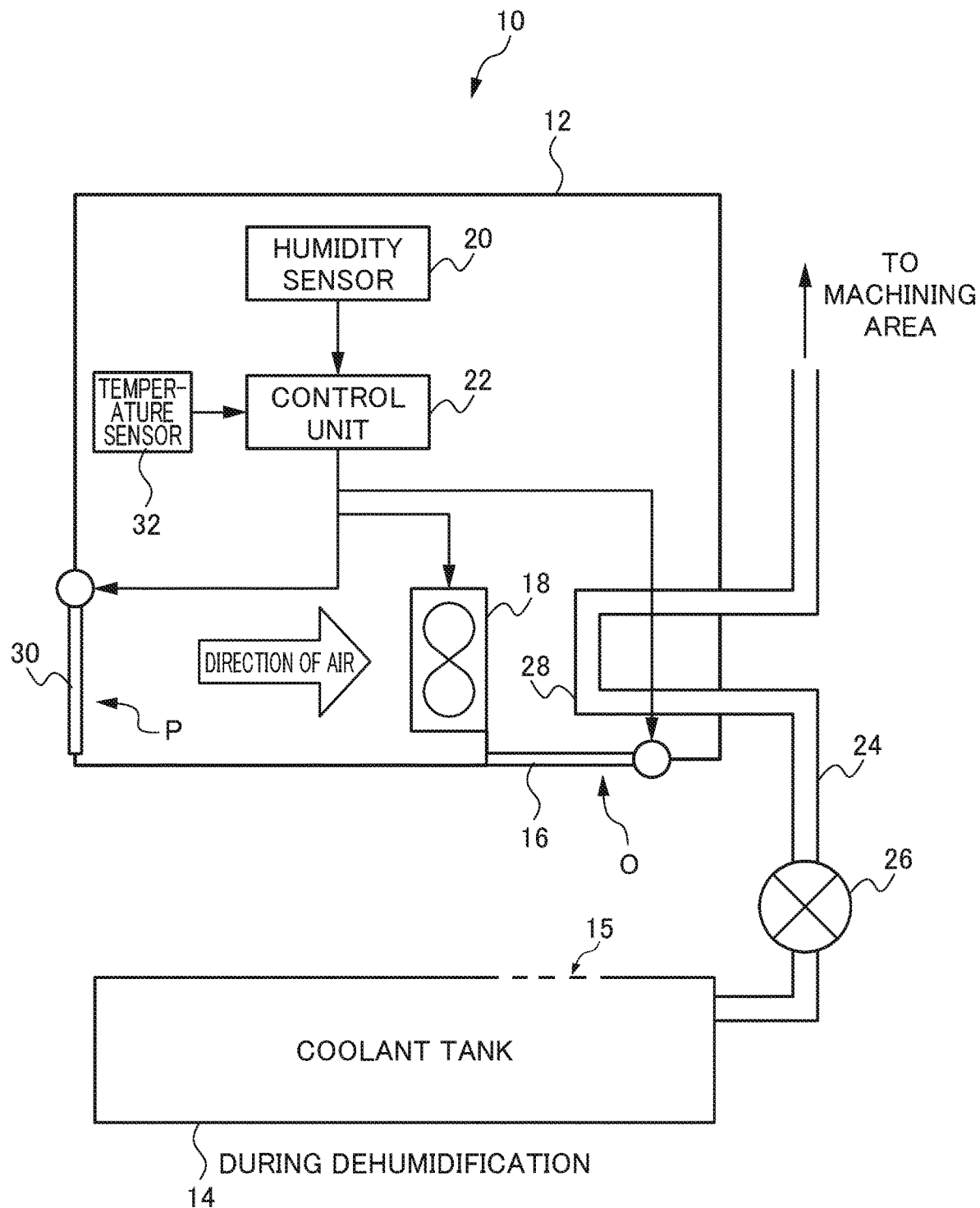
FIG. 3 shows a dehumidifying mode executed in a controller according to a second embodiment of the present invention.
Figure 4:
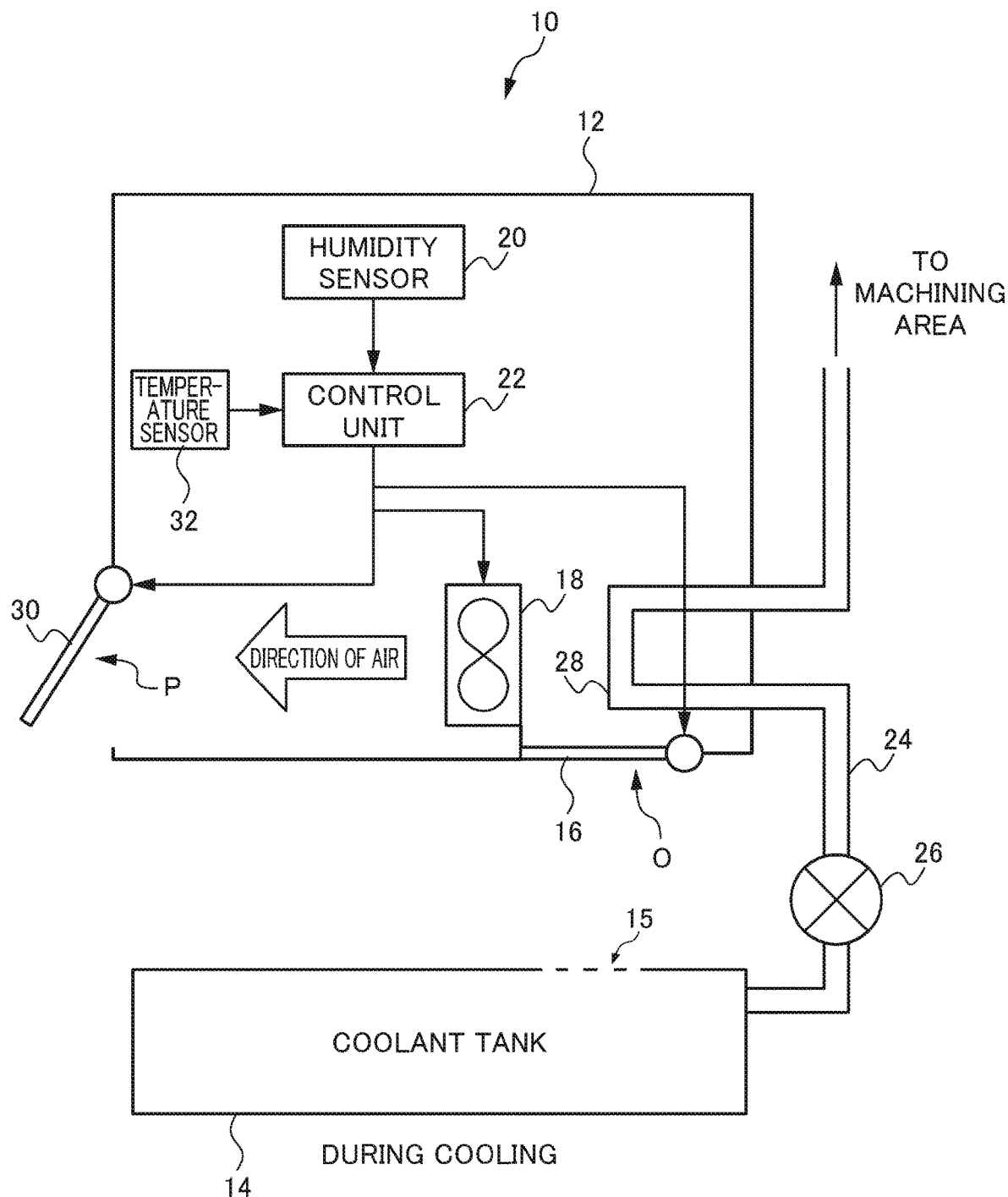
FIG. 4 shows a cooling mode executed in the controller according to the second embodiment of the present invention.
Figure 5:
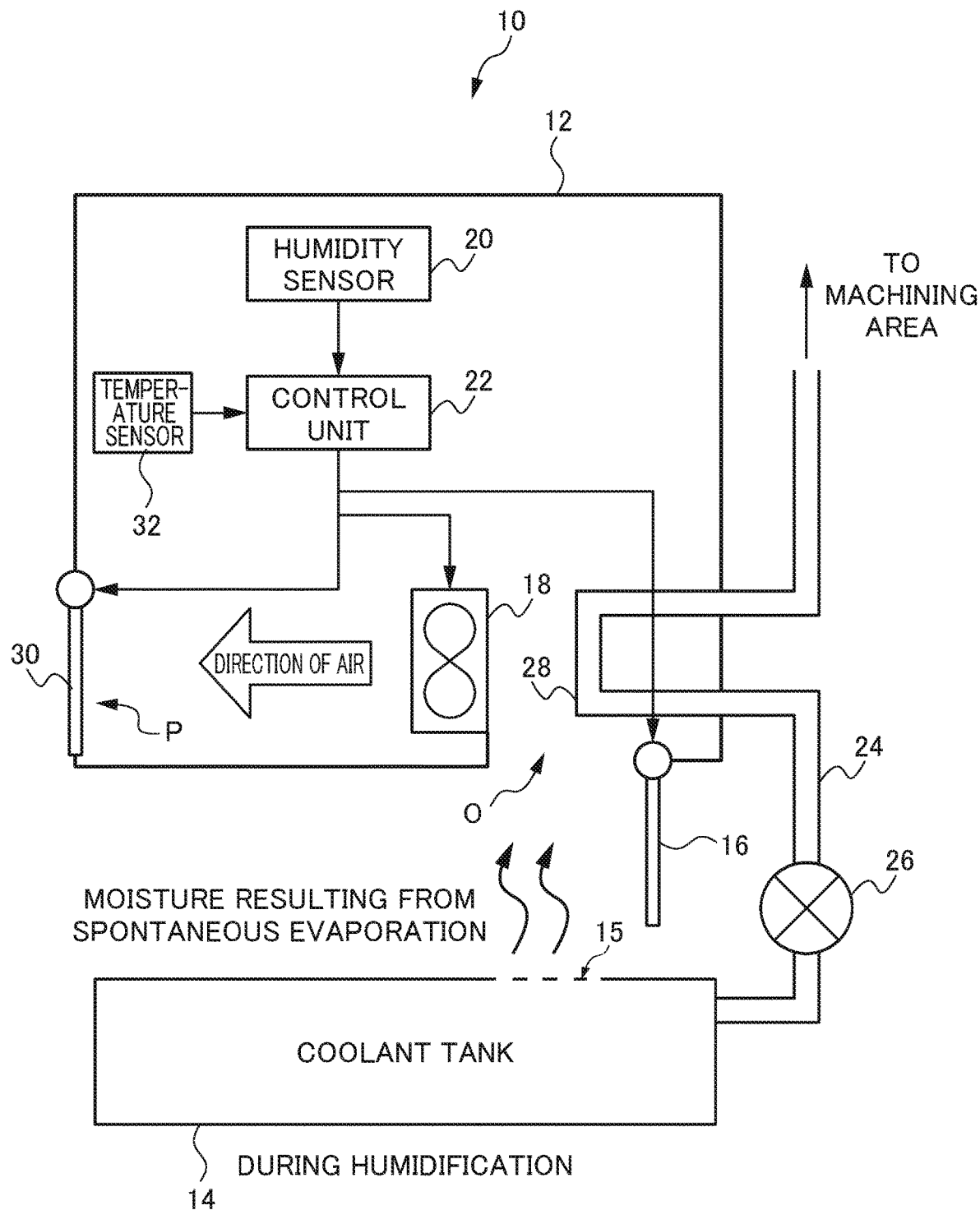
FIG. 5 shows a humidifying mode executed in the controller according to the second embodiment of the present invention.

FIGS. 3 to 5 show a controller according to a second embodiment of the present invention. The second embodiment differs from the first embodiment in that a cooling mode is further prepared. In response to addition of the cooling mode, a second window 30 and a temperature sensor (temperature acquisition unit) 32 are further provided. A member common to that of the first embodiment is given the same sign.

FIG. 3 shows motion in a dehumidifying mode according to the second embodiment. The dehumidifying mode is executed if a humidity detected by the humidity sensor 20 is higher than a predetermined value.

A second opening P is formed at the control panel 12. The second opening P is desirably located at a position where moisture from the coolant tank 14 is unlikely to be taken in and within the reach of air from the fan 18. An openable/closable second window 30 is attached to the second opening P. The second window 30 is usable for closing the second opening P.

If a humidity detected by the humidity sensor 20 is higher than the predetermined value, the control unit 22 closes the first window 16 to close the first opening O. Further, the control unit 22 closes the second window 30 to close the second opening P. The control unit 22 rotates the fan 18 counterclockwise so as to generate an air flow in a direction indicated by an arrow. As described above, water vapor contained in an atmosphere blown against the dehumidifying unit 28 is condensed and the condensed water vapor becomes water droplets. Then, the water droplets are discharged through the outlet (not shown). In this way, the humidity in the control panel 12 is reduced.

FIG. 4 shows motion in the cooling mode according to the second embodiment. The cooling mode is executed only in the dehumidifying mode. The reason for this is that the cooling mode is executed on the assumption that a humidity will be reduced. Specifically, cooling and dehumidification produce additive effects in terms of humidity control, so that they may be done simultaneously.

For the reason given above, if a humidity detected by the humidity sensor 20 is higher than the predetermined value and if a temperature acquired by the temperature sensor 32 is higher than a predetermined value, a transition is made to the cooling mode. After the transition is made to the cooling mode, the control unit 22 opens the second window 30. The control unit 22 rotates the fan 18 clockwise to discharge the high-temperature atmosphere in the control panel 12 through the second opening P. In this way, the temperature in the control panel 12 is reduced.

As described above, in this embodiment, the cooling mode is executed in response to a temperature only in the dehumidifying mode. However, in response to detection of an abnormally high temperature to such a degree that malfunction of a device may occur in a humidifying mode, for example, the cooling mode may be executed. This can prevent a device housed in the control panel 12 from working erroneously due to the high temperature.

FIG. 5 shows motion in the humidifying mode according to the second embodiment. The humidifying mode is executed if a humidity in the control panel 12 detected by the humidity sensor 20 is lower than the predetermined value. The control unit 22 opens the first window 16 and closes the second window 30. Further, the control unit 22 rotates the fan 18 clockwise so as to generate an air flow in a direction indicated by an arrow. Moisture generated from the tank 14 is taken into the control panel 12 through the first opening O. In this way, the humidity in the control panel 12 is increased.

As described above, in addition to the effect achieved by the first embodiment, the configuration of the second embodiment achieves the effect of preventing malfunction of a device housed in the control panel 12 due to temperature abnormality by maintaining a temperature in the control panel 12 properly.

In the first and second embodiments described above, an internal window not shown may be provided. The internal window is provided in the control panel 12 as a partition to define a space from the fan 18 to the first opening O. Specifically, when the first window 16 and the internal window are closed, a wall to which the fan 18 is attached, the internal window, a wall at the control panel 12, and the first window 16 form one closed space. The internal window is opened in the dehumidifying mode, and is closed in the humidifying mode. Provision of the internal window particularly works to increase humidifying effect in the humidifying mode.

The first and second embodiments described above are applicable not only to a control panel for a machine tool but also to a controller for a precision machine such as a robot, for example. The control unit 22 in the first and second embodiments is not required to be provided for each control panel 12. If multiple control panels 12 are arranged in one space, humidities in these control panels 12 are nearly equal. In this case, the control unit 22 can control humidities in the multiple control panels 12 in parallel. Additionally, the humidity sensor 20 and the temperature sensor 32 can be replaced by a dew indicator.

EXPLANATION OF REFERENCE NUMERALS

10 Controller for machine
12 Control panel (housing)
14 Coolant tank (tank)
16 First window
18 Fan
20 Humidity sensor (humidity acquisition unit)
22 Control unit
24 Pipe
30 Second window
32 Temperature sensor (temperature acquisition unit)
O Opening

What is claimed is:

1. A controller for a machine comprising:
   a housing;
   a humidity sensor housed in the housing;
   a fan attached to the housing and blowing air in the housing;
   a first window formed to be openable and closable relative to a first opening formed at the housing;
   a tank with an opening part located at a neighboring position of the first opening and storing a liquid containing water;
   a pipe having a part extending in the housing, and being connected to the tank to let the liquid pass through; and
   a panel controller configured to perform the following operations to control humidity in the housing;
   if a humidity sensed by the humidity sensor is lower than a predetermined value, the panel controller opens the first window, and operates the fan so as to take moisture generated from the tank into the housing, and
   if the humidity sensed by the humidity sensor is higher than the predetermined value, the panel controller closes the first window, and operates the fan so as to feed an atmosphere in the housing toward the part of the pipe.

2. The controller for a machine according to claim 1, further comprising:
   a temperature sensor housed in the housing; and
   a second window formed to be openable and closable relative to a second opening formed at the housing, wherein
   if a temperature sensed by the temperature sensor is higher than a predetermined value, the panel controller opens the second window, and operates the fan so as to discharge an atmosphere in the housing.

* * * * *